US006455415B1

(12) United States Patent
Lopatin et al.

(10) Patent No.: US 6,455,415 B1
(45) Date of Patent: Sep. 24, 2002

(54) METHOD OF ENCAPSULATED COPPER (CU) INTERCONNECT FORMATION

(75) Inventors: Sergey D. Lopatin, Santa Clara, CA (US); Robin W. Cheung, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/836,054

(22) Filed: Apr. 16, 2001

Related U.S. Application Data

(62) Division of application No. 09/296,054, filed on Apr. 21, 1999, now Pat. No. 6,259,160.

(51) Int. Cl.$^7$ .......................................... H01L 21/4763
(52) U.S. Cl. ........................ 438/628; 438/623; 438/638
(58) Field of Search ............................... 438/618, 623, 438/628, 638

(56) References Cited

U.S. PATENT DOCUMENTS

| | | | | |
|---|---|---|---|---|
| 5,567,300 A | * | 10/1996 | Datta et al. | 205/652 |
| 5,612,254 A | * | 3/1997 | Mu et al. | 438/631 |
| 5,695,810 A | | 12/1997 | Dubin et al. | 427/96 |
| 6,100,184 A | * | 8/2000 | Zhao et al. | 438/638 |
| 6,146,986 A | * | 11/2000 | Wagganer | 438/618 |

OTHER PUBLICATIONS

"Smokin . . . Watch Out, Fast Computers Are on the Way Speed Is Now Pushing Computer Power," Andy Maslowski, Apr./May/Jun. 1998, vol. 25, No. 2, pp. 1 and 20 The Electron, published at 4781 E. 355$^{th}$ Street, Willoughby, Ohio, 44094–4698.

"Electroless CoWP Barrier/Protection Layer Deposition for Cu Metallization", S. Lopatin, et al., Material Research Society, Symp. Proc. vol. 451, 1997, pp. 463–468.

"High Aspect Ratio Quarter–micron Electroless Copper Integrated Technology", Yosi Shacham–Diamond, et al., Microelectric Engineering 37/38, 1997, pp. 77–88.

"Processing and Integration of Copper Interconnects," Robert L. Jackson, et al., Solid State Technology, Mar. 1998, Penn Well Publishing Company (15 pages).

"Tantalum, Copper and Damascene: The future of Interconnects," Peter Singer, Semiconductor International, Jun., 1998 (7 pages).

* cited by examiner

Primary Examiner—Trung Dang
Assistant Examiner—William M. Brewster
(74) Attorney, Agent, or Firm—LaRiviere, Grubman & Payne, LLP

(57) ABSTRACT

A method of forming a semiconductor device having selectively fabricated copper interconnect structure that is encapsulated within selectively formed metallic barriers. An exemplary encapsulated copper interconnect structure includes a first low dielectric constant layer (low K1) formed over a substantially completed semiconductor device on which a first sidewall metallic barrier, consisting of metallic material is formed to line the wall structure of a via. The metallic liner encapsulates a first, substantially thin ($\leq 0.25$ $\mu$m) copper interconnect structure. A second selectively formed thicker (>>0.25 $\mu$m) copper interconnect trench structure is formed overlying and integral with the first copper interconnect structure. A second metallic barrier is deposited over the second selectively formed copper interconnect structure and is formed integral with the first sidewall metallic barrier. The fully encapsulated copper interconnect structure can be further processed to spin coat a second low dielectric constant material layer (low K2) formed about it using the same dielectric material that was used for the low K1 layer. The low K2 layer may be further lithographically processed to form a via structure to provide further electrical interconnect means. The present method facilitates the use of low dielectric material which results in a semiconductor structure that is free of $Si_3N_4$ or $SiO_2$ in the copper interconnect region and which overcomes undesirable copper diffusion.

8 Claims, 3 Drawing Sheets

METHOD OF ENCAPSULATED COPPER (CU) INTERCONNECT FORMATION

RELATED APPLICATION(S)

This application is a divisional patent application of, and claims priority from, copending U.S. patent application Ser. No. 09/296,054, entitled "APPARATUS AND METHOD OF ENCAPSULATED COPPER (Cu) INTERCONNECT FORMATION," filed Apr. 21, 1999, issued on Jul. 10, 2001, as U.S. Pat. No. 6,259,160 B1, by the same applicants.

FIELD OF THE INVENTION

The present invention relates to integrated circuits and fabrication techniques for forming interconnect structure. More particularly, the present invention relates to integrated circuits and fabrication techniques for forming interconnect structure out of copper. Even more particularly, the present invention relates to integrated circuits and fabrication techniques for encapsulating interconnect structure that has been fabricated out of copper.

BACKGROUND OF THE INVENTION

In semiconductor wafers utilizing multilayered circuits, damascene metal interconnect lines are used to conduct current through the layers using interconnect structure singularly termed a line and a via. A line is also sometimes referred to as a land and a via is sometimes also referred to as a feed-through hole. These interconnect structure were heretofore usually made of aluminum, but are increasingly being made of copper. Currently, semiconductor technology is moving away from the use of aluminum as the metal of choice in circuitry and toward the use of copper. This move toward the production of copper interconnect structure semiconductors is receiving intense research because copper conducts electricity with lower resistance than aluminum which results in increased microprocessor speed. Additionally, copper uses less power and costs less than aluminum. Also, the physical attributes of copper metal allow for space-saving circuitry design. A discussion of the move toward copper in semiconductor devices can be found in "Smokin . . . Watch Out, Fast Computers are on the way Speed is now Pushing Computing Power," by Andy Maslowski, The Electron, April/May/June 1998, Vol. 25, No.2, pp. 1 and 20.

A published article concerning the challenges to industry in making the move to copper interconnects in integrated circuits and a brief teaching of the fundamentals of copper electroplating is an article entitled "Tantalum, Copper, and Damascene: The Future of Interconnects" by Peter Singer, Semiconductor International, June 1998. The challenges have been accepted by industry, but have resulted in copper interconnect structures that need special encapsulating fabrication techniques to overcome the characteristic that copper diffuses into silicon and silicon dioxide and reacts with most metals and silicides such as Al, Ti, $CoSi_2$, NiSi, and $TiSi_2$, which are commonly used in microelectronic devices. See "Electroless CoWP Barrier/Protection Layer Deposition For Cu Metallization," S. Lopatin et al., Material Research Society, 1997, pp. 463–468; "High Aspect Ratio Quartermicron Electroless Copper Integrated Technology," Yosi Shacham-Diamand et al., Microelectronic Engineering, 1997, pp. 77–88; and Dubin et al.(U.S. Pat. No. 5,695,810).

U.S. Pat. No. 5,695,810 teaches a technique of encapsulating copper circuit interconnect lines in a CoWP (cobalt-tungsten-phosphide) barrier including a capping step with the CoWP material. Other known fabrication techniques include single-Damascene process, or dual-Damascene process. In the single-Damascene process, either the interconnect lines, or the vias, are fabricated separately, while in the dual-Damascene process, both vias and interconnect lines are fabricated concurrently. The dual-Damascene fabrication process has the limitation of requiring high-k dielectric constant layers that are used to overcome etch-uniformity problems that occur during trench etch fabrication steps. The dual-Damascene fabrication process also has the problem of maintaining adequate seed layer step coverage in designs involving a via or a trench structure whose cross-sectional area has a high aspect ratio (i.e., where the via height to width ratio is at least 3:1). Further, dual-Damascene fabrication problems include concerns about via bottom opening to Cu and cleaning.

Thus, a need exists for an invention which provides an improved semiconductor device having a copper interconnect structure that overcomes undesirable copper diffusion characteristic by using selective electroplated copper fabrication techniques.

A need also exists for an invention which provides an improved semiconductor device having a copper interconnect structure that overcomes undesirable copper diffusion characteristic which is fabricated such that silicon nitride and silicon dioxide layers are not required.

Another need also exists for an invention which provides an improved semiconductor device having a copper interconnect structure that overcomes undesirable copper diffusion characteristic and which is fabricated such that copper interconnect structure in the less than 0.2-$\mu$m range is facilitated.

Yet another need also exists for an invention which provides an improved semiconductor device having a copper interconnect structure that overcomes undesirable copper diffusion characteristic and which is fabricated such that the copper interconnect structure formed by selective electroplated copper fabrication techniques is encapsulate in metal barriers.

Still another need also exists for an invention which provides an improved semiconductor device having a copper interconnect structure that overcomes undesirable copper diffusion characteristic and which is fabricated such that the copper interconnect structure can be formed by with minimal concerns about seed layer step coverage.

BRIEF SUMMARY OF THE INVENTION

Accordingly, and by example only, the present invention addresses the related art needs by providing a method for fabricating a semiconductor device having copper interconnect structure fabricated by a process that comprises the steps of initially forming a blanket copper (Cu) layer formed by electroplating a Cu layer over a semiconductor device which has been previously fabricated to a stage having circuit elements in need of being electrically energized, and or, being electrically coupled to other circuit elements to perform an electronic function of the semiconductor device. By example, in formation of a copper via interconnect structure, a blanket of electroplated Cu layer structure is fabricated over a low dielectric constant material (referred to herein as low K1 material) such as poly(arylene ether) ("PAE"), fluorinated aromatic ether ("FLARE"), fluorinated polyimide ("FPI"), benzocyclobutene ("BCB"), hydrogen silsesquioxane ("HSQ"), methyl silsesquioxane ("MSQ"), xerogel, and fluorinated glass. The low K1 dielectric layer has previously undergone a photolithographic process and comprises at least one via for forming an interconnect structure. The via's sidewalls and the surface of the low K1 dielectric layer structure further comprise a metal barrier layer, such as tantalum (Ta), tantalum nitride (TaN) and tungsten nitride WN, fabricated such that the metal barrier covers the surface and extends into the via to form a sidewall liner structure.

Using Cu chemical vapor deposition and/or Cu electroplating techniques, a substantially thin ($\leq 0.25$ μm) blanket of copper is formed to cover the metal barrier surface and also fill the metal barrier-lined via structure. It should be emphasized that the filled via structure is also substantially thin ($\leq 0.25$ μm). A photoresist layer is then fabricated over the electroplated Cu layer and then by means of a photolithographic process, and by example only, a trench structure, is formed overlying the previously Cu-filled via structure. The trench structure is selectively Cu electroplated such that it is substantially thicker than the previously Cu-filled via structure (>>0.25 μm) and bonds with the previously Cu-filled underlying via structure. After the photoresist is removed, an electropolishing step, or etching step removes the substantially thin blanket of copper formed on the metal barrier surface and shapes the bonded Cu-electroplated via-trench structure.

The electropolishing step, or etching step, is further controlled to stop at the metal barrier on the surface of the low K1 material to assure that a metallic interface exists for the subsequent metallic capping step. In forming the metallic barrier cap and by controlling the electropolishing step, or etching step, the metal barrier on the surface of the low K1 material is removed, while regions of metal barrier that flare about the via structure are not removed. The metallic capping step comprises a selective electroless metal barrier deposition, preferably comprising CoWP (cobalt-tungsten-phosphide), over the bonded Cu-electroplated via-trench structure, and over to the edges of the portions of metal barrier liner material flaring from the via structure in the low K1 material. The bonded Cu-electroplated via-trench structure, termed the copper interconnect, is effectively encapsulated within the CoWP deposited metal barrier and the metallic barrier liner in the via structure.

The encapsulated copper interconnect can be further processed to spin coat a low dielectric constant material layer (termed herein as low K2 material), using the same dielectric material that was used for the low K1 layer. The low K2 layer may then be further lithographically processed to form a via structure to provide further electrical interconnect means. The process of the present invention facilitates the use of low dielectric material which results in a semiconductor structure that is free of $Si_3N_4$ or $SiO_2$, in the copper interconnect region and which comprises copper interconnect structure that overcomes undesirable copper diffusion characteristic.

Advantages of the present invention include, but are not limited to providing an improved semiconductor device having a copper interconnect structure that overcomes undesirable copper diffusion characteristic by using selective electroplated copper fabrication techniques; providing an improved semiconductor device having a copper interconnect structure that overcomes undesirable copper diffusion characteristic which is fabricated such that silicon nitride and silicon dioxide layers are not required; providing an improved semiconductor device having a copper interconnect structure that overcomes undesirable copper diffusion characteristic and which is fabricated such that copper interconnect structure in the less than 0.2-μm range is facilitated; providing an improved semiconductor device having a copper interconnect structure that overcomes undesirable copper diffusion characteristic and which is fabricated such that the copper interconnect structure formed by selective electroplated copper fabrication techniques is encapsulate in metal barriers; and providing an improved semiconductor device having a copper interconnect structure that overcomes undesirable copper diffusion characteristic and which is fabricated such that the copper interconnect structure can be formed by with minimal concerns about seed layer step coverage. Further advantages of the invention will be brought out in the following portions of the specification, wherein the detailed description is for the purpose of fully disclosing preferred embodiments of the invention without placing limitations thereon.

BRIEF DESCRIPTION OF DRAWINGS

For a better understanding of the present invention, reference is made to the below-referenced accompanying drawing(s) which is/are for illustrative purposes and where like reference numbers denote like elements.

DETAILED DESCRIPTION OF THE INVENTION

Figure 1:
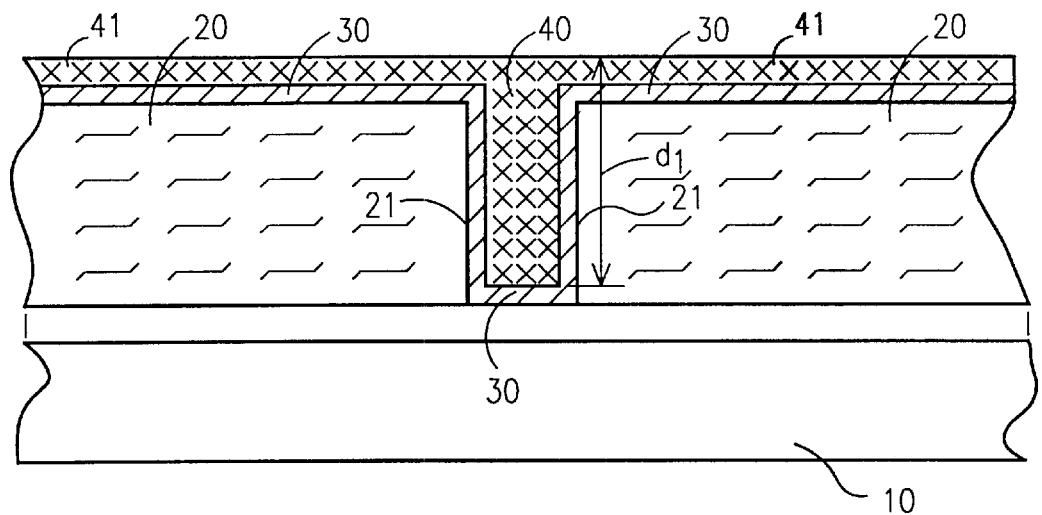
FIG. 1 is an enlarged cross-sectional view of the present invention showing a semiconductor circuit device fabricated having a metal barrier layer deposited over a low dielectric constant (low K) material layer and a substantially thin ($\leq 0.25$ μm) blanket of copper deposited over the metal barrier layer for forming an interconnect structure in accordance with the present invention.

FIG. 1 shows a semiconductor device 10 fabricated to a stage for having a composite copper interconnect structure 40, 53 fabricated by a process in accordance with the teaching of the present invention. More particularly, the semiconductor device has been previously fabricated to a stage having integrated circuit elements in need of being electrically energized, and or, being electrically coupled to other integrated circuit elements to perform an electronic function of the semiconductor device 10. The process of the present invention comprises forming a first insulating layer 20 over semiconductor substrate 10. First insulating layer 20 being formed and selected from a material group characterized as having a lower dielectric constant (low K1) than a dielectric constant of silicon dioxide ($SiO_2$) and silicon nitride ($Si_3N_4$). The preferred material group consisting material such as poly(arylene ether) ("PAE"), fluorinated aromatic ether ("FLARE"), fluorinated polyimide ("FPI"), benzocyclobutene ("BCB"), hydrogen silsesquioxane ("HSQ"), methyl silsesquioxane ("MSQ"), xerogel, and fluorinated glass. The first insulating layer 20 has a first access means 21 formed to facilitate formation of an electrical interconnect path and accessing the underlying semiconductor device 10, said first access means having a walled structure which in a may be in the form of a via structure or a trench structure. As illustrated in FIG. 1, the access means 21 is preferably a via structure 21. FIG. 1 further shows a first metallic barrier 30 formed over first insulating layer 20. The first metallic barrier 30 comprises metal material such as tantalum (Ta), tantalum nitride (TaN), and tungsten nitride WN. First metallic barrier 30 being formed not only to blanket the upper surface 22 of first insulating layer 20, but also such that the metallic barrier material extends into and lines the walls of the via structure 21 with a metallic barrier measuring less than 25 nm in thickness. Via structure 21, by example has a diameters measuring less than 0.25 $\mu$m, and a depth d1 that is substantially greater than 0.25 $\mu$m. These type of via structures are characterized as having a high aspect ratio and are known to present problems of via bottom opening and cleaning in prior art dual damascene processes. FIG. 1 further shows a first metal structure 40, 41 formed from a conductive metal material, which according to the present invention, comprises electroplating copper over planar regions of the metallic barrier 30 and within metallic barrier-lined via region 21. It should be emphasized that the filled via structure is also substantially thin ($\leq 0.25$ $\mu$m). The conductive metals contemplated by the present invention comprise metal, such as copper, which have undesirable diffusion characteristic and which need to be encapsulated to maintain the desirable conductive properties.

Figure 2:
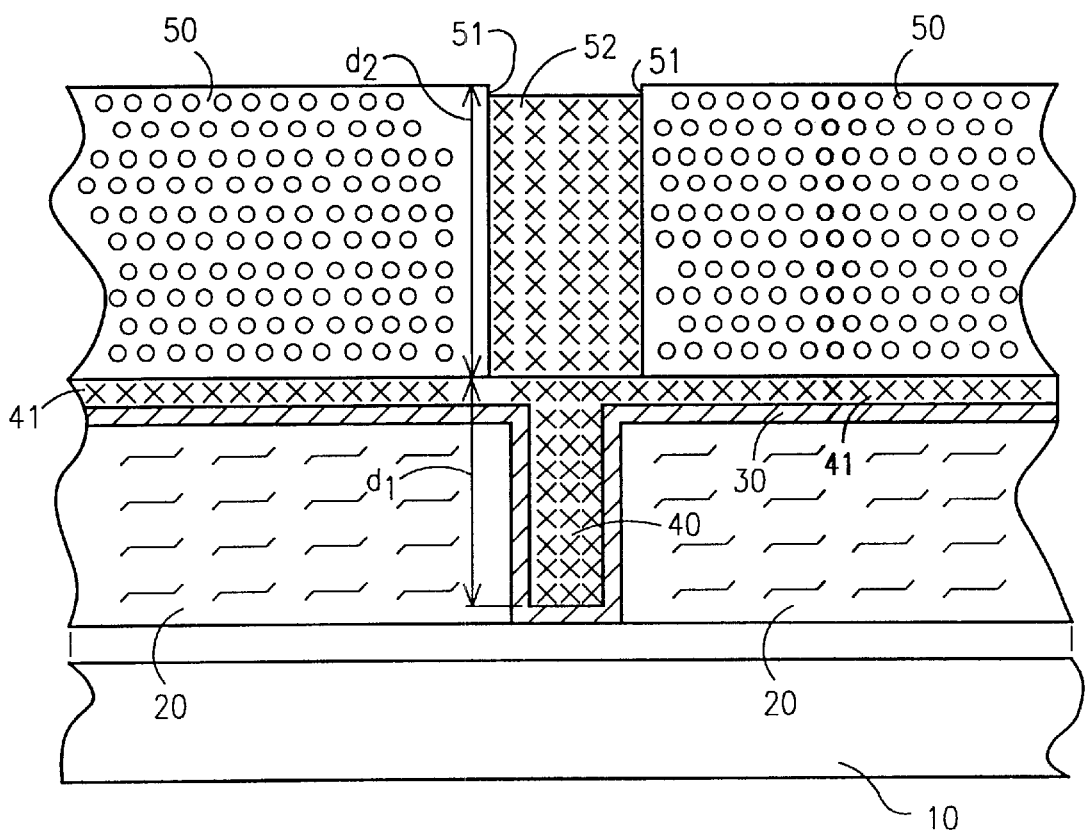
FIG. 2 is an enlarged cross-sectional view of the present invention showing the semiconductor device of FIG. 1 further processed with a photoresist material having an overlying trench region selectively filled with a substantially thick (>>0.25 μm) amount of copper for forming an interconnect structure in accordance with the present invention.

FIG. 2 shows a photoresist layer 50 having a thickness d2 (>>0.25 $\mu$m) that is substantially larger than d1. Photoresist layer 50 facilitates formation, by example, of a trench structure 51, formed over the previously metal filled via structure 40, or in accordance with the present invention, over the copper filled via structure 40. FIG. 2 further shows formation of a second metal structure 52 within trench structure 51. Metal structure 52, in accordance with the present invention, comprises selectively electroplating copper within trench structure 51. It should be appreciated that trench structure 51 comprises a second access means which could be formed as a via structure. Further, the trench structure 51 is selectively Cu-electroplated such that the copper is substantially thicker (>>0.25 $\mu$m) than the previously Cu-filled via structure and bonds at metal interface region 54, (see FIG. 4) with the previously Cu-filled underlying via structure 40.

Figure 3:
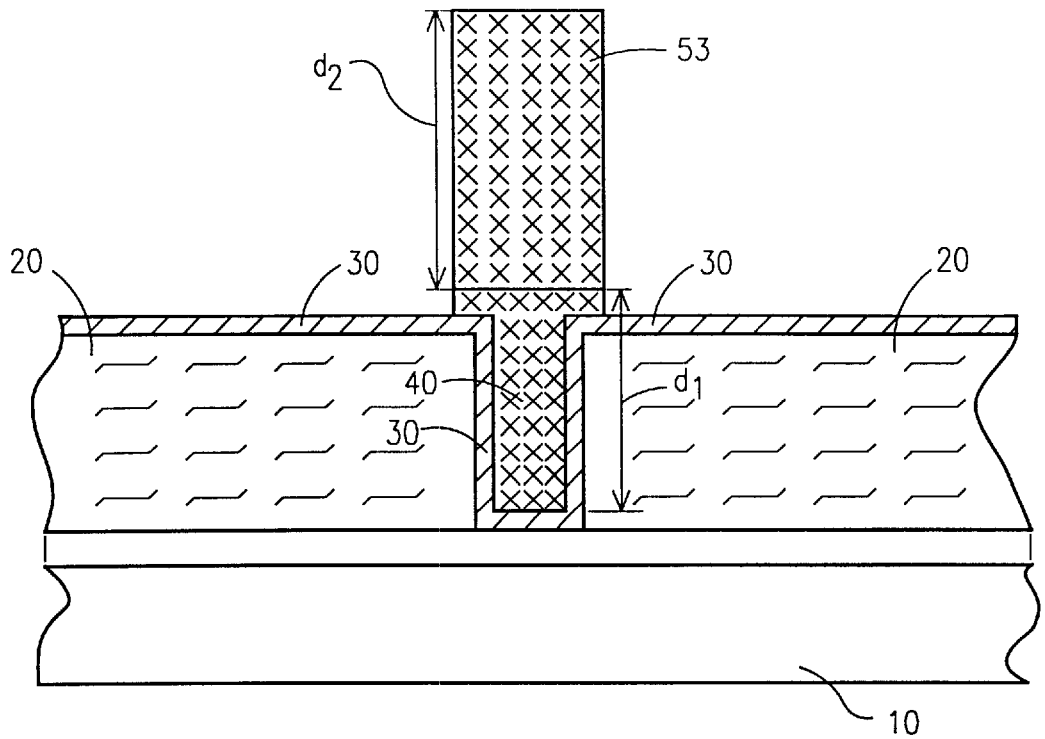
FIG. 3 is an enlarged cross-sectional view of the present invention showing the semiconductor device of FIG. 2 further processed with the photoresist material and selected portions of the substantially thin layer of copper removed for delineating an elevated structure consisting of the substantially thicker (>>0.25 μm) amount of copper used to fill the trench region depicted in FIG. 2, in accordance with the present invention.

FIG. 3 shows an enlarged cross-sectional view of the present invention showing the semiconductor device 10 of FIG. 2 further processed with the photoresist material 50 and selected portions of the second metal structure 52 removed. After the photoresist 50 is removed, an electropolishing step removes the substantially thin blanket of the first metal structure, or copper blanket portion 41 formed on metal barrier 30 to shape the bonded Cu electroplated via-trench structure 53, 40. The electropolishing step is further controlled to stop at the metal barrier 30 on the surface 22 of the low K1 material 20 to assure that a metallic interface exists for the subsequent metallic capping, or encapsulating step. Essentially, by shaping second metal structure 52 and portions of first metal structure 40 delineates an elevated metal structure portion 53. Delineated elevated metal structure portion 53 being supported by exposed portions 61 of first metallic barrier 30. Elevated metal structure portion 53 and first metal structure portions 40 formed within via structure 21 form a composite metal interconnect structure 40, 53

Figure 4:
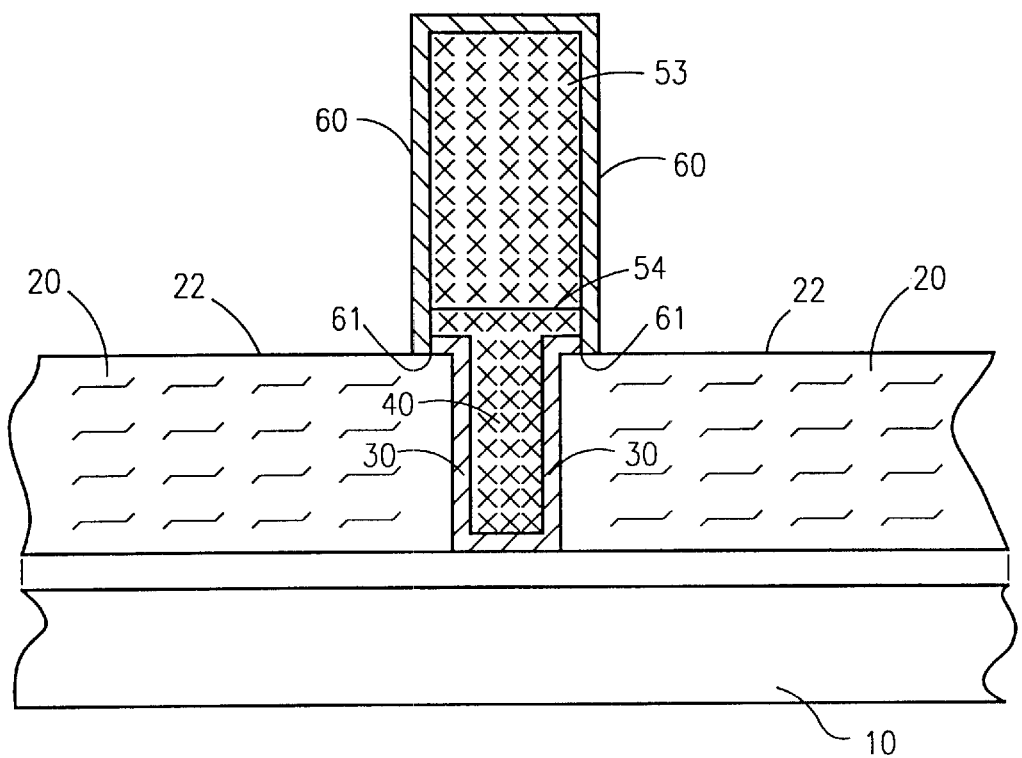
FIG. 4 is an enlarged cross-sectional view of the present invention showing the semiconductor device of FIG. 3 further processed by removing portions of the metal barrier layer, as depicted in FIG. 1, and deposition of a selective encapsulating metal barrier over the delineated elevated copper structure shown in FIG. 3, in accordance with the present invention.

As shown in FIG. 4 the metallic barrier 30 is selectively removed by controlling an electropolishing step down to the surface 22 of the low K1 material 20. As shown in FIG. 4, exposed metallic regions 61 of metallic barrier 30 flare about the metal-filled via structure 40 and are not removed. The metallic encapsulating step comprises forming a second metallic barrier 60 over said composite metal interconnect structure 40,53. The second metallic barrier being selective electroless metal barrier, preferably formed by deposition of CoWP (cobalt-tungsten-phosphide), over the composite metal interconnect structure 40, 53. Second metallic barrier 60 is formed to bond to the exposed metallic regions 61 flaring from the via structure 21 in the low K1 material 20. The composite metal interconnect structure 40, 53, in accordance with the present invention, comprise bonded Cu-electroplated via-trench structure at region 54 and may be termed a copper interconnect structure. The first metallic barrier portion 30 and second metallic barrier 60 forms an encasement that effectively encapsulates the copper interconnect structure 40, 53.

Figure 5:
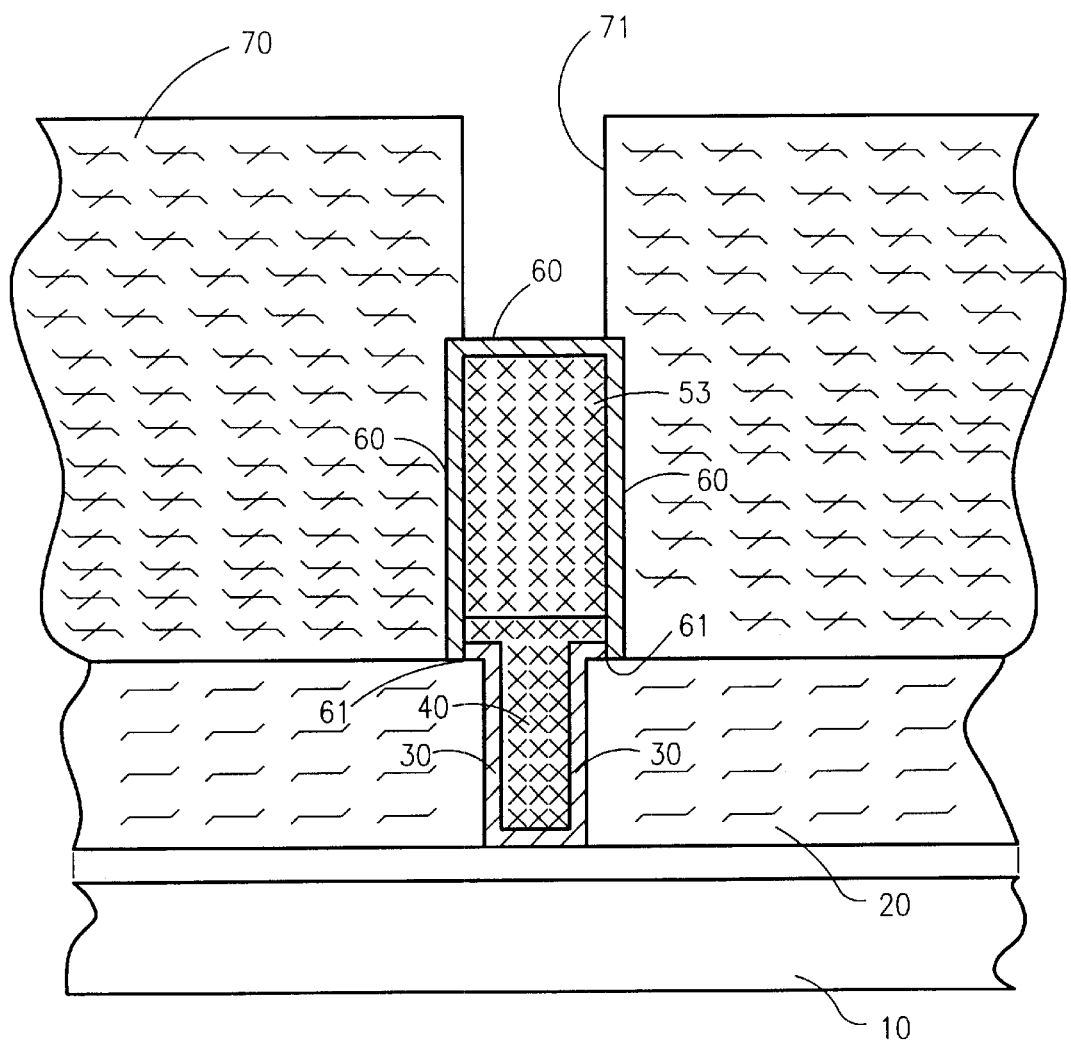
FIG. 5 is an enlarged cross-sectional view of the present invention showing the semiconductor device of FIG. 4 further processed by spin coat formation of a low K dielectric layer formed about the encapsulated copper interconnect structure shown in FIG. 4, and overlying the first low K dielectric material layer, as depicted in FIG. 1, and having a via structure formed for forming additional interconnect structure.

As shown in FIG. 5, the encapsulated copper interconnect structure 40, 53 can be further processed to spin coat a low dielectric constant material layer 70 (termed herein as low K2 material), using the same dielectric material that was used for the low K1 layer. The low K2 layer may the be further lithographically processed to form a via structure 71 to provide further electrical interconnect means.

Accordingly, the process of the present invention facilitates the use of low dielectric material which results in a semiconductor structure that is free of $Si_3N_4$ or $SiO_2$, in the copper interconnect region and which comprises copper interconnect structure that overcomes undesirable copper diffusion characteristic.

Information as herein shown and described in detail is fully capable of attaining the above-described object of the invention, the presently preferred embodiment of the invention, and is, thus, representative of the subject matter which is broadly contemplated by the present invention. The scope of the present invention fully encompasses other embodiments which may become obvious to those skilled in the art, and is to be limited, accordingly, by nothing other than the appended claims, wherein reference to an element in the singular is not intended to mean "one and only one" unless explicitly so stated, but rather "one or more." All structural and functional equivalents to the elements of the above-described preferred embodiment and additional embodiments that are known to those of ordinary skill in the art are hereby expressly incorporated by reference and are intended to be encompassed by the present claims.

Moreover, no requirement exists for a device or method to address each and every problem sought to be resolved by the present invention, for such to be encompassed by the present claims. Furthermore, no element, component, or method step in the present disclosure is intended to be dedicated to the public regardless of whether the element, component, or method step is explicitly recited in the claims. However, it should be readily apparent to those of ordinary skill in the art that various changes and modifications in form, semiconductor material, and fabrication material detail may be made without departing from the spirit and scope of the inventions as set forth in the appended claims. No claim herein is to be construed under the provisions of 35 U.S.C. 112, sixth paragraph, unless the element is expressly recited using the phrase "means for."

What is claimed:

1. A method of fabricating a semiconductor device, having an encapsulated copper interconnect structure, comprising:
    (a) providing a semiconductor substrate that accommodates an electrical interconnect structure;
    (b) forming a first copper interconnect structure comprising an elevated copper interconnect portion over a first metallic barrier,
        said first copper interconnect structure being formed within a via structure lined with said first metallic barrier,
        said via structure being formed within a first insulating layer formed over said semiconductor substrate, and
        said first metallic barrier lined via structure having a constant rectangular cross-sectional area of high aspect ratio in a range of at least 3:1;
    (c) forming a second copper interconnect structure directly on said elevated copper interconnect structure portion of said first copper interconnect structure,
        said elevated copper interconnect structure portion being in contact with portions of said first metallic barrier,
        said elevated copper interconnect structure and said first metallic barrier each having at least one exposed portion, and
        said elevated copper interconnect structure portion and said portion of said first copper interconnect structure and said second copper interconnect structure, thereby forming a composite copper interconnect structure;
    (d) forming a second metallic barrier over said at least one elevated copper interconnect structure exposed portion and over said second copper interconnect structure, said second metallic barrier being formed such that said exposed portions of said first metallic barrier bond with corresponding portions of said second metallic barrier to form an encasement that encapsulates said composite copper interconnect structure; and
    (e) forming a second insulating layer over said first insulating layer and about said encased composite copper interconnect structure.

2. A method, as recited in claim 1, wherein said first and second insulating layers comprise a material selected from a material group having a dielectric constant lower than that of silicon dioxide (SiO$_2$) and silicon nitride (Si$_3$N$_4$).

3. A method, as recited in claim 1, wherein said material group consists essentially of polyarylene ether ("PAE"), fluorinated aromatic ether ("FLARE"), fluorinated polyimide ("FPI"), benzocyclobutene ("BCB"), hydrogen silsesquioxane ("MSQ"), xerogel, and fluorinated glass.

4. A method, as recited in claim 1, wherein said first and second copper interconnect structures comprise an electroplated copper formed such that said second copper interconnect structure is substantially thicker than said first copper interconnect structure.

5. A method, as recited in claim 1, wherein said first copper interconnect structure has a thickness not greater than 0.25 μm.

6. A method, as recited in claim 1, wherein said first metallic barrier comprises at least one material selected from a group consisting essentially of tantalum (Ta), tantalum nitride (TaN), and tungsten nitride (WN).

7. A method, as recited in claim 1, wherein said second metallic barrier comprises cobalt-tungsten-phosphide ("CoWP").

8. A method of fabricating a semiconductor device, having an encapsulated copper interconnect structure, comprising:
    (a) providing a semiconductor substrate that accommodates an electrical interconnect structure;
    (b) forming a first copper interconnect structure, comprising an elevated copper interconnect portion, over a first metallic barrier,
        said first copper interconnect structure being formed within a via structure lined with said first metallic barrier,
        said via structure being formed within a first insulating layer formed over said semiconductor substrate, and
        said first metallic barrier lined via structure having a constant rectangular cross-sectional area of high aspect ratio in a range of at least 3:1;
    (c) forming a second copper interconnect structure directly on said elevated copper interconnect structure portion of said first copper interconnect structure,
        said elevated copper interconnect structure portion being in contact with portions of said first metallic barrier,
        said elevated copper interconnect structure and said first metallic barrier each having at least one exposed portion, and
        said elevated copper interconnect structure portion and said portion of said first copper interconnect structure and said second copper interconnect structure, comprising a composite copper interconnect structure;
    (d) forming a second metallic barrier over said at least one elevated copper interconnect structure exposed portion and over said second copper interconnect structure, said second metallic barrier being formed such that said exposed portions of said first metallic barrier bond with corresponding portions of said second metallic barrier to form an encasement that encapsulates said composite copper interconnect structure; and
    (e) forming a second insulating layer over said first insulating layer and about said encased composite copper interconnect structure,
    wherein said first and second insulating layers comprise a material selected from a material group having a dielectric constant lower than that of silicon dioxide (SiO$_2$) and silicon nitride (Si$_3$N$_4$),
    wherein said material group consists essentially of polyarylene ether ("PAE"), fluorinated aromatic ether ("FLARE"), fluorinated polyimide ("FPI"), benzocyclobutene ("BCB"), hydrogen silsesquioxane ("MSQ"), xerogel, and fluorinated glass,
    wherein said first and second copper interconnect structures comprise an electroplated copper formed such that said second copper interconnect structure is substantially thicker than said first copper interconnect structure,
    wherein said first copper interconnect structure has a thickness not greater than 0.251 μm, wherein said first metallic barrier comprises at least one material selected from a group consisting essentially of tantalum (Ta), tantalum nitride (TaN), and tungsten nitride (WN), and wherein said second metallic barrier comprises cobalt-tungsten-phosphide (CoWP).

* * * * *